(12) United States Patent
Tanigaki et al.

(10) Patent No.: US 11,011,344 B2
(45) Date of Patent: May 18, 2021

(54) INTERFEROMETRIC ELECTRON MICROSCOPE

(71) Applicants: HITACHI, LTD., Tokyo (JP); RIKEN, Wako (JP)

(72) Inventors: Toshiaki Tanigaki, Tokyo (JP); Tetsuya Akashi, Tokyo (JP); Ken Harada, Wako (JP)

(73) Assignees: HITACHI, LTD., Tokyo (JP); RIKEN, Saitama (JP)

( * ) Notice: Subject to any disclaimer, the term of this patent is extended or adjusted under 35 U.S.C. 154(b) by 0 days.

(21) Appl. No.: 16/787,662

(22) Filed: Feb. 11, 2020

(65) Prior Publication Data
US 2020/0273657 A1  Aug. 27, 2020

(30) Foreign Application Priority Data

Feb. 22, 2019 (JP) .............................. JP2019-030348

(51) Int. Cl.
*H01J 37/141* (2006.01)
*H01J 37/26* (2006.01)
(Continued)

(52) U.S. Cl.
CPC ............ *H01J 37/141* (2013.01); *H01J 37/09* (2013.01); *H01J 37/147* (2013.01); *H01J 37/261* (2013.01); *H01J 37/295* (2013.01)

(58) Field of Classification Search
CPC ........ H01J 37/09; H01J 37/141; H01J 37/147; H01J 37/261; H01J 37/295; H01J 37/2955
See application file for complete search history.

(56) References Cited

U.S. PATENT DOCUMENTS

| 5,811,806 A * | 9/1998 | Honda | H01J 37/26 |
| | | | 250/306 |
| 8,785,851 B2 * | 7/2014 | Tanigaki | H01J 37/295 |
| | | | 250/311 |

(Continued)

FOREIGN PATENT DOCUMENTS

JP  2013246911 A  12/2013

OTHER PUBLICATIONS

Yasin et al, "A Tunable Path-Separated Electron Interferometer With an Amplitude-Dividing Grating Beamsplitter", Appl. Phys. Lett 113, 233102 (Year: 2018).*

(Continued)

*Primary Examiner* — David E Smith
(74) *Attorney, Agent, or Firm* — Miles & Stockbridge, P.C, (57) ABSTRACT

An interferometric electron microscope with increased irradiating electric current density which causes electron waves to interfere with each other and includes: an electron source; an irradiating lens system a focusing lens system an observational plane an artificial grating disposed between the electron source and the irradiating lens system and diffracting the electron beam emitted from the electron source to produce a first electron wave and a second electron wave; an electron beam biprism deflecting the first electron wave and the second electron wave to pass the first electron wave through the specimen for use as an object wave and to use the second electron wave as a reference wave; and an electron beam biprism in a focusing system deflecting the objective wave and the reference wave to superimpose the objective wave and the reference wave on the observational plane to produce an image.

12 Claims, 9 Drawing Sheets

(51) Int. Cl.
*H01J 37/09* (2006.01)
*H01J 37/147* (2006.01)
*H01J 37/295* (2006.01)

(56) References Cited

U.S. PATENT DOCUMENTS

| | | | |
|---|---|---|---|
| 9,558,909 B2* | 1/2017 | Li | H01J 37/073 |
| 9,679,738 B2* | 6/2017 | Matsumoto | G01N 23/20058 |
| 10,884,379 B2* | 1/2021 | Boureau | H01J 37/26 |
| 2012/0241612 A1* | 9/2012 | Harada | H01J 37/26 |
| | | | 250/311 |
| 2013/0284925 A1* | 10/2013 | Tanigaki | H01J 37/22 |
| | | | 250/311 |
| 2013/0313432 A1 | 11/2013 | Tanigaki et al. | |
| 2014/0197312 A1* | 7/2014 | Harada | H01J 37/243 |
| | | | 250/307 |

OTHER PUBLICATIONS

Yasin et al, "A Tunable Path-Separated Electron Interferometer With an Amplitude-Dividing Beamsplitter", Appl., Phys. Lett 113, 233102 (2018) (Year: 2018).*

A. Tonomura, "Applications of electron holography", Rev. Mod. Phys. 59 , No. 3, Jul. 1987, pp. 639-669.

G. Pozzi, "Off-axis image electron holography: a proposal", Optik 47 (1977), No. 1, pp. 105-107.

\* cited by examiner

INTERFEROMETRIC ELECTRON MICROSCOPE

BACKGROUND OF THE INVENTION

1. Field of the Invention

The present invention relates to an apparatus that uses a particle beam having a wave nature, and more particularly to an electron-wave interference technology such as an interferometric electron microscope or the like. Although the present description refers to an electron microscopy, the present invention is also applicable to an apparatus that uses a particle beam having a wave nature other than an electron beam.

2. Description of the Related Art

The electron-wave interference technology is represented by a process of measuring amplitude changes and phase changes of an electron wave to quantitively measure a specimen structure or material or an electromagnetic field in vacuum.

Figure 1:
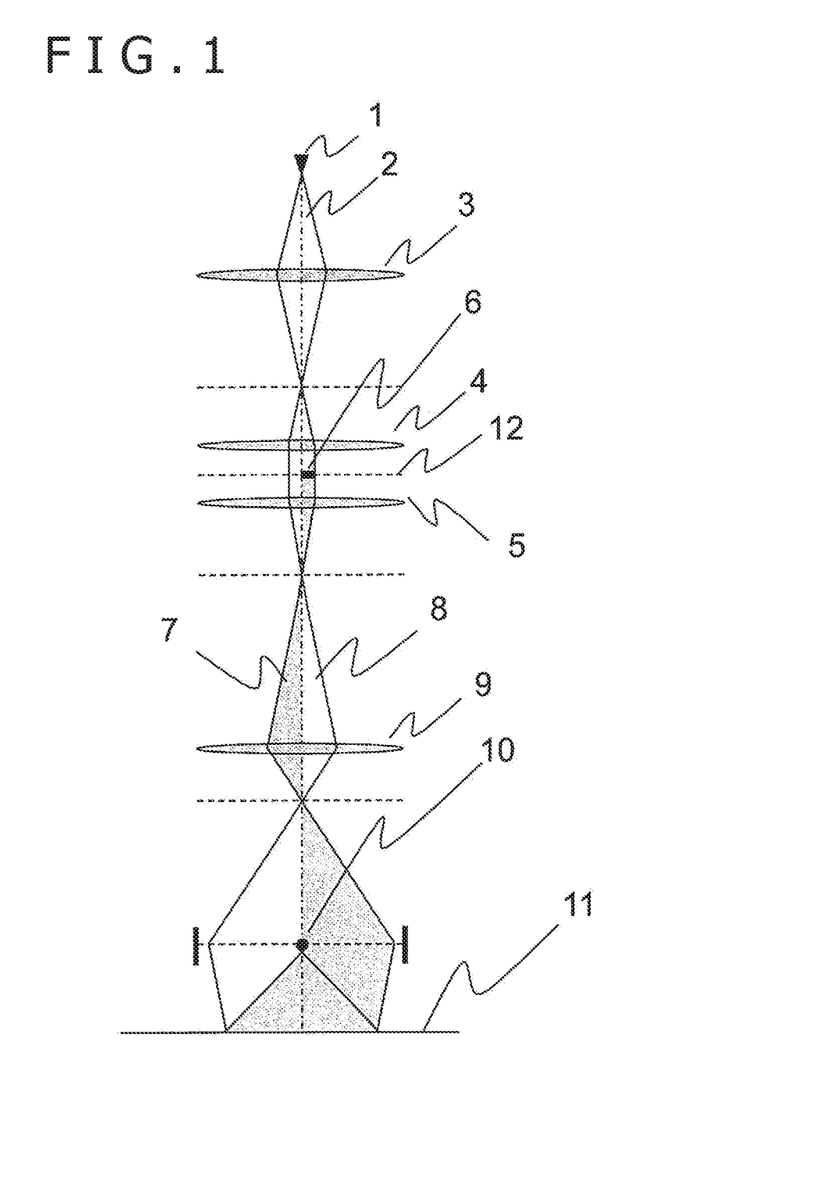
FIG. 1 is a schematic view of a conventional interferometric electron microscope.

FIG. 1 of the accompanying drawings illustrates an interferometric optical system for conventional electron beam holography. An electron wave 2 emitted from an electron beam source 1 travels as illustrated. The electron wave 2 has its electric current density adjusted by a first irradiating electron lens 3 and a second irradiating electron lens 4, and irradiates a specimen 6 disposed on one side of the optical axis between the second irradiating electron lens 4 and an objective lens 5 with an electron beam. An image obtained by the objective lens 5 is magnified by a magnification lens 9. An electron wave 7 that has passed through a first area, i.e., the specimen, of a specimen plane 12 and an electron wave 8 that has passed through a second area of the specimen plane 12 are converged by an electron beam biprism 10 in a focusing system, and superimposed on each other on an observation plane 11 where they interfere with each other, producing interference fringes, hereinafter also referred to as hologram. The electron wave is reproduced from the hologram to determine a change that is caused therein by the specimen 6. The electron wave 7 that has passed through the first area, reflecting information of the specimen 6, will also be referred as an object wave 7, whereas the electron wave 8 that has passed through the second area as a reference wave 8.

According to the above interferometric process, the electron wave 7 that passes through the first area and the electron wave 8 that passes through the second area are adjacent to each other at the specimen position. The width of an interference area as converted on the specimen plane is limited by the coherence length along the directions in the specimen plane of the electron wave applied to the specimen plane, see A. Tonomura, "Applications of electron holography," Rev. Mod. Phys. 59 (1987), p. 639-669.

The coherence length of the electron wave in the interferometric process can be increased by using a light source of high luminance or lowering an irradiating electric current density. However, the luminance of light sources is subject to physical limitations because electrons tend to diverge due to repulsive forces therebetween in light sources or while in propagation. Consequently, an attempt to increase the coherence length and an attempt to reduce the irradiating electric current density are incompatible with each other. The measurement sensitivity per unit time is thus limited, posing limitations on time resolution and final measurement sensitivity.

As a process of eliminating the limitations on the measurement sensitivity, there has been devised an idea of bringing a diffracted wave and a transmitted wave from a crystal into interference with each other, see G. Pozzi, "Off-axis image electron holography: a proposal," Optik 47 (1977) No. 1, p. 105-107. Another advantage obtained by using diffracted waves is that though only a field-emission electron gun of high luminance has heretofore been used as an electron source for interferometric microscopes, diffracted waves eliminates limitations on the luminance of light sources, making it possible to use various electron sources of low luminance, e.g., $LaB_6$, for interferometric microscopes.

Processes that use diffracted waves from crystals suffer the following problems:

The first problem is that since a crystal is irradiated by an electron beam having a diameter of several nm, the irradiated area of the crystal tends to be contaminated and damaged by the electron beam, making it impossible to make measurements under constant conditions over a long period of time.

The second problem is that the intensity of a diffracted wave from a crystal is not uniform, failing to make highly accurate measurements. It may be considered that an electron wave that reflects the information of a specimen can be determined to a certain extent by measuring a reference hologram in the absence of the specimen and finding the difference between the reference hologram and a hologram including the specimen. However, since a diffracted wave used as the electron wave 7 that has passed through the first area and specimen information, i.e., a change given to a uniform wave motion field when the wave motion field is transmitted through the specimen, are multiplied by each other, even if the reference hologram is used, information of the electron wave that has passed through the first area before it irradiates the specimen and the specimen information cannot separately be calculated.

The third problem is that a crystal is a three-dimensional structural body and is unable to bring about an ideal one-dimensional diffraction. Although a state near a one-dimensional diffraction can be created to a certain extent by tilting the crystal, it is difficult to cause a perfect one-dimensional diffraction and, in addition, high-order diffraction cannot be controlled.

The fourth problem is that the distance between an object wave and a reference wave on a specimen position is determined by the lattice spacing of a crystal and the design of an electrooptical system, resulting in no degree of freedom for observational conditions. It is very important for interferometric electron microscopes to have degrees of freedom for observational conditions when taking account of applications to various measurement targets.

It is an object of the present invention to provide an interferometric electron microscope which will solve the above problems, is capable of increasing an irradiating electric current density, is free of problems caused by using a crystal, and is able to freely control the distance between an object wave and a reference wave on a specimen plane.

SUMMARY OF THE INVENTION

To achieve the above object, there is provided in accordance with the present invention, for example, an interferometric electron microscope causing electron waves to interfere with each other, including: an electron source; an irradiating lens system irradiating a specimen with an electron beam emitted from the electron source; a focusing lens system focusing an image of the specimen; an observational plane used for observing the image of the specimen focused by the focusing lens system; an artificial grating disposed between the electron source and the irradiating lens system and diffracting the electron beam emitted from the electron source to produce a first electron wave and a second electron wave; an electron beam biprism in an irradiating system, disposed in the irradiating lens system and deflecting the first electron wave and the second electron wave to pass the first electron wave through the specimen for use as an object wave and to use the second electron wave as a reference wave; and an electron beam biprism in a focusing system, disposed in the focusing lens system and deflecting the objective wave and the reference wave to superimpose the objective wave and the reference wave on the observational plane so as to produce an image.

According to the present invention, it is possible to provide an interferometric electron microscope which is capable of increasing an irradiating electric current density, is free of problems caused by using a crystal, and is able to freely control the distance between an object wave and a reference wave on a specimen plane.

DESCRIPTION OF THE PREFERRED EMBODIMENTS

Prior to the description of various interferometric electron microscopes according to preferred embodiments of the present invention, the principles and makeup of an interferometric electron microscope based on a transmission electron microscopy according to the present invention will be described below with reference to FIG. 2. The principles and makeup of the interferometric electron microscope to be described below are applicable to the various interferometric electron microscopes according to the preferred embodiments to be described later.

Figure 2:
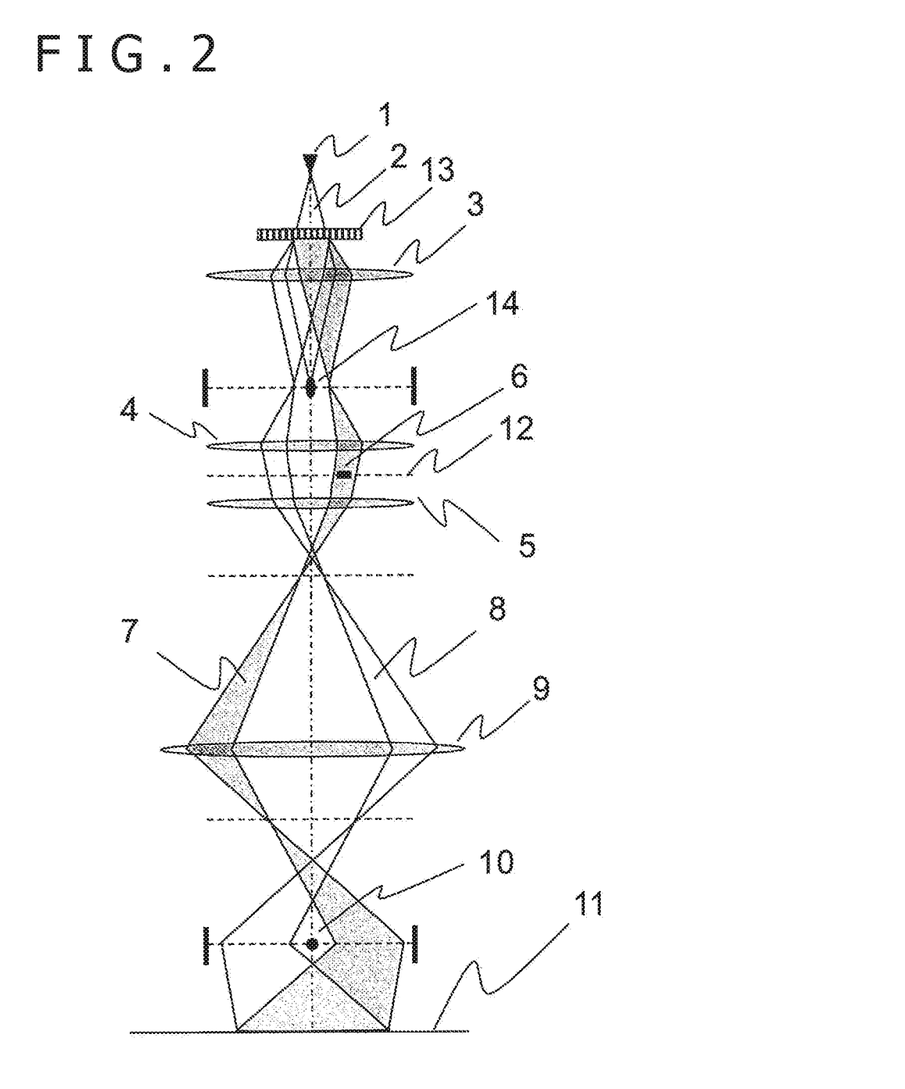
FIG. 2 is a schematic view illustrating the principles and makeup of an interferometric electron microscope according to the present invention.

As illustrated in FIG. 2, an electron wave 2 emitted from an electron source 1 is applied to an artificial grating 13 disposed downstream of the electron source 1 with respect to the direction along which an electron beam travels.

The artificial grating 13 is a two-dimensional structural body fabricated by a focused ion beam apparatus, is irradiated by the electron wave 2 in an irradiation area ranging from several 100 nm to several 10 micrometers, and has several tens to several hundreds of grating bars in the irradiation area. Since the irradiation area in which the artificial grating 13 is irradiated by the electron wave 2 is much wider than an irradiation area of several nm in which a crystal is irradiated by the electron wave 2 to produce a diffracted wave, any contamination or damage caused to the artificial grating 13 by an electron beam applied thereto can almost be ignored. The artificial grating 13 is essentially free of diffracted wave irregularities which may be caused by a slight crystal curvature in case a crystal is used and also diffracted wave irregularities which may be caused by changes in the thickness of a crystal, and can produce a uniform diffracted wave.

The grating bars of the artificial grating 13 are not limited to an equally spaced parallel pattern, but may be of a pattern designed to intentionally cause a diffracted wave to have a particular phase distribution. For example, the grating bars of the artificial grating 13 may be designed to give an inverted component of a microscope lens aberration to a diffraction wave for the purpose of correcting the microscope lens aberration. Alternatively, the artificial grating 13 may be a forked grating for producing a helical wave.

An electron beam biprism 14 in an irradiating system that is disposed between diffracted waves diffracted by the artificial grating 13 deflects the electron waves inwardly toward or outwardly from the optical axis, thereby controlling the positions where an electron wave 7 that passes through a first area at a specimen position and an electron wave 8 that passes through a second area irradiate a specimen plane 12. A first irradiating electron lens 3 and a second irradiating electron lens 4 act to control the electric current densities on the specimen plane 12 of the electron wave 7 that passes through the first area where the specimen 6 is placed and the electron wave 8 that passes through the second area free of the specimen 6. The two electron waves 7 and 8 irradiate the respective two areas on the specimen plane 12.

The electron beam biprism 14 includes an electrode filament disposed between flat plates parallel to the direction along which the electron waves travel. The electron beam biprism 14 has a function to deflect the electron waves that pass on the left and right of the electrode filament inwardly toward or outwardly from the optical axis with electric fields that are produced between the filament electrode and the flat plates parallel thereto by applying a potential to the electrode filament. Generally, there has been available on the market a system having a mechanism rotatable about the optical axis and a mechanism for moving an electron beam biprism in a plane perpendicular to the optical axis. In the present description, with respect to the electron beam biprism, in case its electrode filament is to be strictly referred to in the optical system, it will be written as "the electrode filament of the electron beam biprism" or "the electrode filament," and in case it is to used commonly as an electron beam deflector, it will be referred to as "the electron beam biprism," though they are denoted by the same reference character.

An image of the specimen 6 is focused by an objective lens 5 positioned downstream of the specimen 6. The focusing action is taken over by a magnifying lens 9 disposed downstream of the objective lens 5, finally focusing the image of the specimen 6 on an observational plane 11 of an interferometric electron microscope based on a transmission electron microscopy that is an electron beam apparatus.

Having passed through the specimen plane, the electron wave 7 that passes through the specimen 6 placed in the first area and the electron wave 8 that passes through the second area have their electron beams deflected with respect to the optical axis by an electron beam biprism 10 in a focusing system that is disposed in shadow areas of the two electron waves. The electron waves are then superimposed on each other on the observational plane 11 of the interferometric electron microscope and interfere with each other to produce a hologram. The hologram is detected by an electron microscopy film or an electron beam detector such as a charge coupled device (CCD) camera or the like.

The interferometric electron microscope of the structure described above, combined with a holography electron microscope including a plurality of biprisms, not a single biprism, disposed between the specimen and the electron beam detector, makes it possible to adjust interference fringe intervals and the width of an interference area as desired.

With the above arrangement of the interferometric electron microscope according to the present invention, the diffracted waves from the artificial grating 13 disposed between the electron source 1 and the specimen 6 are used as an object wave and a reference wave to increase the irradiating electric current density while guaranteeing the interference of the waves. The electron beam biprism 14 in the irradiating system controls the distance in the specimen plane 12 between the electron wave 7 that passes through the first area, i.e., the specimen 6, and the electron wave 8 that passes through the second area, and the lenses of the irradiating system control the electric current densities, on the specimen plane 12, of the electron wave 7 that passes through the specimen 6 in the first area where the specimen 6 is placed and the electron wave 8 that passes through the second area. The second electron beam biprism 10 in the focusing system superimposes the first electron wave and the second electron wave on the observational plane 11, producing a high-contrast hologram with a high irradiating electric current density.

The measurement sensitivity per unit time of the interferometric electron microscope is thus increased, resulting in the effect of increasing time resolution for observations such as electromagnetic field observations or the like.

It is also possible to produce, with a high electric current density, a high-magnification high-contrast hologram of an inward area of a thin-film specimen as viewed from an edge thereof, which has not been observed by conventional electron holography, making it possible to reduce the noise of a reproduced phase image upon phase reproduction of a hologram and perform highly accurate phase analysis.

Various embodiments of the present invention will hereinafter be described below.

Embodiment 1

Figure 3:
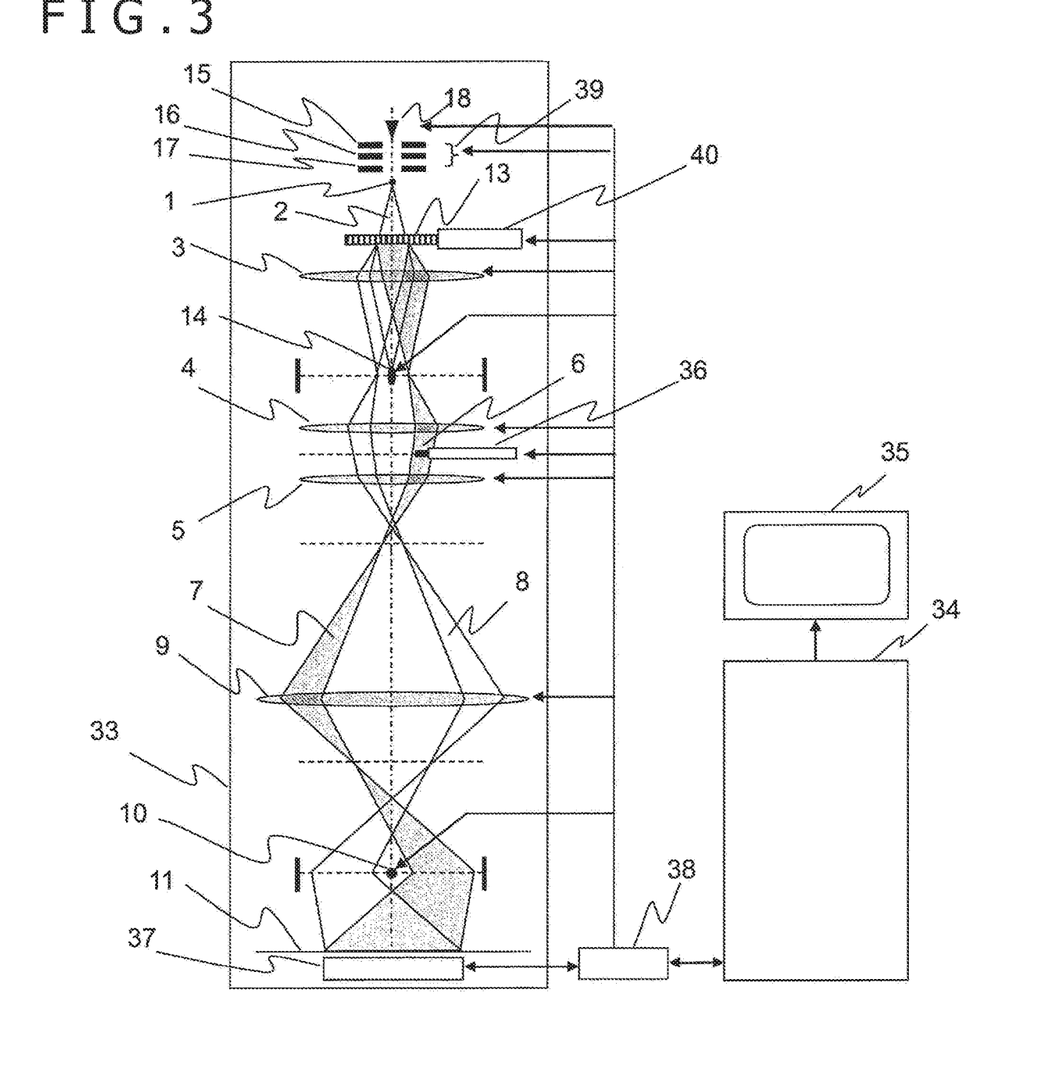
FIG. 3 is a view illustrating the makeup of an interferometric electron microscope according to a first embodiment of the present invention.

FIG. 3 is a schematic view illustrating an optical system of an interferometric electron microscope according to a first embodiment of the present invention.

In FIG. 3, a physical electron source 18 is positioned in a most upstream region with respect to the direction along which an electron beam flows therefrom. A voltage is applied to a first extracting electrode 15, a second extracting electrode 16, and an accelerating electrode 17, accelerating an electron wave emitted from the physical electron source 18 and converging the electron wave on an electrooptical electron source 1. In the present description, the first extracting electrode 15, the second extracting electrode 16, and the accelerating electrode 17 are collectively defined as an accelerating tube 39. The applied voltage is controlled to change the wavelength and also trajectory of the electron beam. Since it can electrooptically be said that an electron wave is emitted from the electrooptical electron source 1, the electrooptical electron source 1 will hereinafter be referred to as the electron source 1.

An artificial grating 13 is disposed between the accelerating tube 39 and a specimen 6 downstream of the electron source 1 with respect to the direction along which an electron beam travels. Although a lens and an aperture of an irradiating system between the accelerating tube 39 and the artificial grating 13 are not illustrated in FIG. 3, they are used as is the case with general microscopes and are omitted from illustration. Electron waves from the artificial grating 13 are deflected from the optical axis by an electron beam biprism 14 in an irradiating system positioned between the artificial grating 13 and the specimen 6 and are directed toward a second irradiating electron lens 4.

The electron beam biprism 14 in the irradiating system includes an electrode filament disposed on the optical axis of the electron beam on a plane onto which an image of the electron source 1 is focused as a virtual image or a real image by an electron lens of the irradiating system. A 0th-order diffracted wave that has passed through the artificial grating 13 is interrupted by the electrode filament of the electron beam biprism 14 in the irradiating system, whereas left and right +/−1st-order diffracted waves that have passed through the artificial grating 13 are used as an object wave 7 and a reference wave 8, respectively. Thus, the object wave 7 and the reference wave 8 have substantially the same amplitude and phase, and also have respective phase distributions which are of opposite signs but have substantially the same absolute values.

In case the electron filament of the electron beam biprism 14 is to interrupt the 0th-order diffracted wave that has passed through the artificial grating 13, the electron filament is required to have a thickness large enough to prevent the electron wave from passing therethrough in relation to the accelerating voltage for the electron wave. Generally, an electrode filament is fabricated by coating the surface of a glass filament having a circular cross-sectional shape with a conductive metal such as platinum. The electrode filament according to the present embodiment should preferably be of a shape having a thickness along the direction in which an electron beam is propagated in order to interrupt the electron beam.

The electron beam biprism 14 in the irradiating system can be of a dual arrangement. The electron filament of one of the electron beam biprisms of the irradiating system is disposed on a plane onto which an image of the electron source as the light source is focused as a virtual image or a real image by an electron lens of the irradiating system, thereby controlling the distance on the specimen plane between the object wave 7 and the reference wave 8. The other electron beam biprism of the irradiating system is disposed in a position on the specimen plane in the irradiating system that is optically equivalent to the specimen 6 to make it possible to control the angles at which the object wave 7 and the reference wave 8 irradiate the sample plane. Details of a holography electron microscopy in which dual biprisms in an irradiating system control two electron waves in the above fashion are disclosed in JP-2013-246911-A. In case a plurality of irradiating system lenses are used, there are a plurality of planes that are optically equivalent to an electron source and a plurality of planes optically equivalent to a specimen plane in a focusing system, and there are a plurality of locations where the electron beam biprism in the irradiating system can be installed. Details of a process of installing the electron beam biprism in the irradiating system in such a case are also disclosed in JP-2013-246911-A.

A first irradiating electron lens 3 and the second irradiating electron lens 4 act to control the electric current densities and positions, on the specimen plane 12, of the electron wave 7 that passes through the first area, i.e., the specimen 6, and the electron wave 8 that passes through the second area. The two electron waves 7 and 8 irradiate the respective two areas on the specimen plane.

With the interferometric electron microscope illustrated in FIG. 3, the voltages applied to the physical electron source 18 and the accelerating tube 39, a specimen inching mechanism 36, an artificial grating inching mechanism 40, the excited states of the electron lenses, and the voltage applied to the electron beam biprisms are controlled by a control system 38 that is connected to a control personal computer (PC) 34. The interferometric electron microscope actually includes, in addition to the components illustrated in FIG. 3, a deflecting system for changing the direction in which the electron beam travels, an aperture mechanism for limiting the area through which the electric beam is transmitted, etc., and those components are also controlled by the control system 38 connected to the control PC 34. These additional components are omitted from illustration as they have no direct bearing on the interferometric electron microscope disclosed in the present description.

The control PC 34 has an ordinary computer arrangement including a central processing unit (CPU), a memory as a storage unit, an input/output interface, etc. as processing portions connected to each other. In the present description, the PC 34 and the control system 38 that control the apparatus may be collectively referred to as a controller of the apparatus. The controller may not necessarily be in the form of a single computer, but may include a computer for controlling the electron beam biprisms separately from a computer for controlling the other components of the interferometric electron microscope. In such a case, those computers may be collectively referred to as a controller. As illustrated in FIG. 3, the electrooptical elements are housed in a microscope housing 33 as a vacuum chamber that is continuously evacuated by a vacuum pump. The vacuum system is omitted from illustration and description as it has no direct bearing on the interferometric electron microscope according to the present invention.

In the arrangement illustrated in FIG. 3, the control system 38 connected to the control PC 34 can apply a desired voltage to the electron beam biprism 14 in the irradiating system for controlling, as desired, the distance on the specimen plane between the electron wave 7 that passes through the specimen 6 placed in the first area and the electron wave 8 that passes through the second area at the position of the specimen 6. Furthermore, the distance on the specimen plane between the electron wave 7 that passes through the first area, i.e., the specimen 6, and the electron wave 8 that passes through the second area at the position of the specimen 6 can also be controlled by the action of the lenses in the irradiating system.

An apparatus arrangement that has a plurality of irradiating electron lenses by adding more irradiating electron lenses makes it possible to increase a control range for the distance on the specimen plane between the electron wave 7 that passes through the first area, i.e., the specimen 6, and the electron wave 8 that passes through the second area at the position of the specimen 6 and also to increase an adjustment range for the electric current densities of the electron waves 7 and 8.

In the case of electromagnetic lenses, when the lens action of the irradiating system is changed for changing the electric current densities on the specimen plane, as the electron beam is converged while rotating helically in the microscope, the positional relationship between the electron wave 7 that passes through the first area, i.e., the specimen 6, and the electron wave 8 that passes through the second area at the position of the specimen 6 rotates in the plane, changing the distance therebetween. In order to prevent the positional relationship between the electron wave 7 that passes through the first area, i.e., the specimen 6, and the electron wave 8 that passes through the second area at the position of the specimen 6 from rotating in the plane even when the electric current densities on the specimen plane are changed, the orientations of the artificial grating 13 and the biprism can be rotated in a plane perpendicular to the optical axis in ganged relation to the lens electric currents in the irradiating system.

Since the ganged relationship is inherent in the apparatus, the control PC 34 can store a data file about the ganged operation, and at the same time that the lens electric currents in the irradiating system are changed, the control system 38 can call the data file and rotate the orientations of the artificial grating 13 and the biprism by quantities registered in the data file in directions registered in the data file. The control process allows the user act stress-free to change the electric current densities on the specimen plane to easily keep the positional relationship between the rotating directions in the specimen plane of the electron wave 7 that passes through the specimen 6 placed in the first area and the electron wave 8 that passes through the second area at the position of the specimen 6.

An image of the specimen 6 is focused by an objective lens 5 positioned downstream of the specimen 6 with respect to the direction along which the electron beam travels. The focusing action is taken over by a magnifying lens 9 disposed downstream of the objective lens 5, finally focusing the image of the specimen 6 on an observational plane 11 of the interferometric electron microscope.

Having passed through the specimen plane, the electron wave 7 that passes through the specimen 6 placed in the first area and the electron wave 8 that passes through the second area have their electron beams deflected with respect to the optical axis by an electron beam biprism 10 in a focusing system that is disposed in shadow areas of the two electron waves. An interference image obtained when the electron waves are superimposed on each other on the observational plane 11 of the interferometric electron microscope and interfere with each other is detected by an electron microscopy film or an electron beam detector 37 such as a CCD camera or the like.

A plurality of magnifying lens and a plurality of biprisms, not depicted, can be placed between the specimen 6 and the observational plane 11 for providing desired interference conditions. As described above, particular interference conditions can be stably provided by keeping the lens electric currents in the irradiating system and the orientation of the biprism in ganged relationship. Similarly, in the focusing system, it is also effective to rotate the orientations of the lens electric currents in the focusing system and the biprism in the focusing system in ganged relationship. These ganged conditions are stored in the control PC 34 and can be called for appropriate operations when necessary.

An apparatus arrangement that has a plurality of magnifying lenses by adding more magnifying lenses makes it possible to increase a range for controlling the magnifying magnification ratio, the positional relationship between the electrode filament of the electron beam biprism and the image plane in the focusing system, and the relationship between the positions of the electrode filament of the electron beam biprism and the position where the electron beam is converged in the focusing system, and also makes it possible to control the observing magnification ratio, interference fringe intervals, and the width of an interference area as desired. Interference fringes detected by the electron beam detector 37 are reproduced immediately or after being saved in the control PC 34, by the control PC 34 through the control system 38, and a reproduced image is displayed on a monitor 35. The reproducing process will not be described in detail as it has already been known in the art.

According to the present embodiment, in addition to providing the advantages described in relation to the above principles and makeup according to the present invention, it is possible to make highly accurate observations excluding the 0th-order diffracted wave because the electrode filament of the electron beam biprism in the irradiating system is disposed on the optical axis of the electron beam on the plane onto which an image of the electron source is focused as a virtual image or a real image by the electron lens of the irradiating system, and the 0th-order diffracted wave that has passed through the artificial grating is interrupted by the electrode filament of the electron beam biprism in the irradiating system. Moreover, inasmuch as the electrode filament of the electron beam biprism in the irradiating system interrupts the 0th-order diffracted wave, a mask that will be described below in Embodiment 2 is not required.

Embodiment 2

Figure 4:
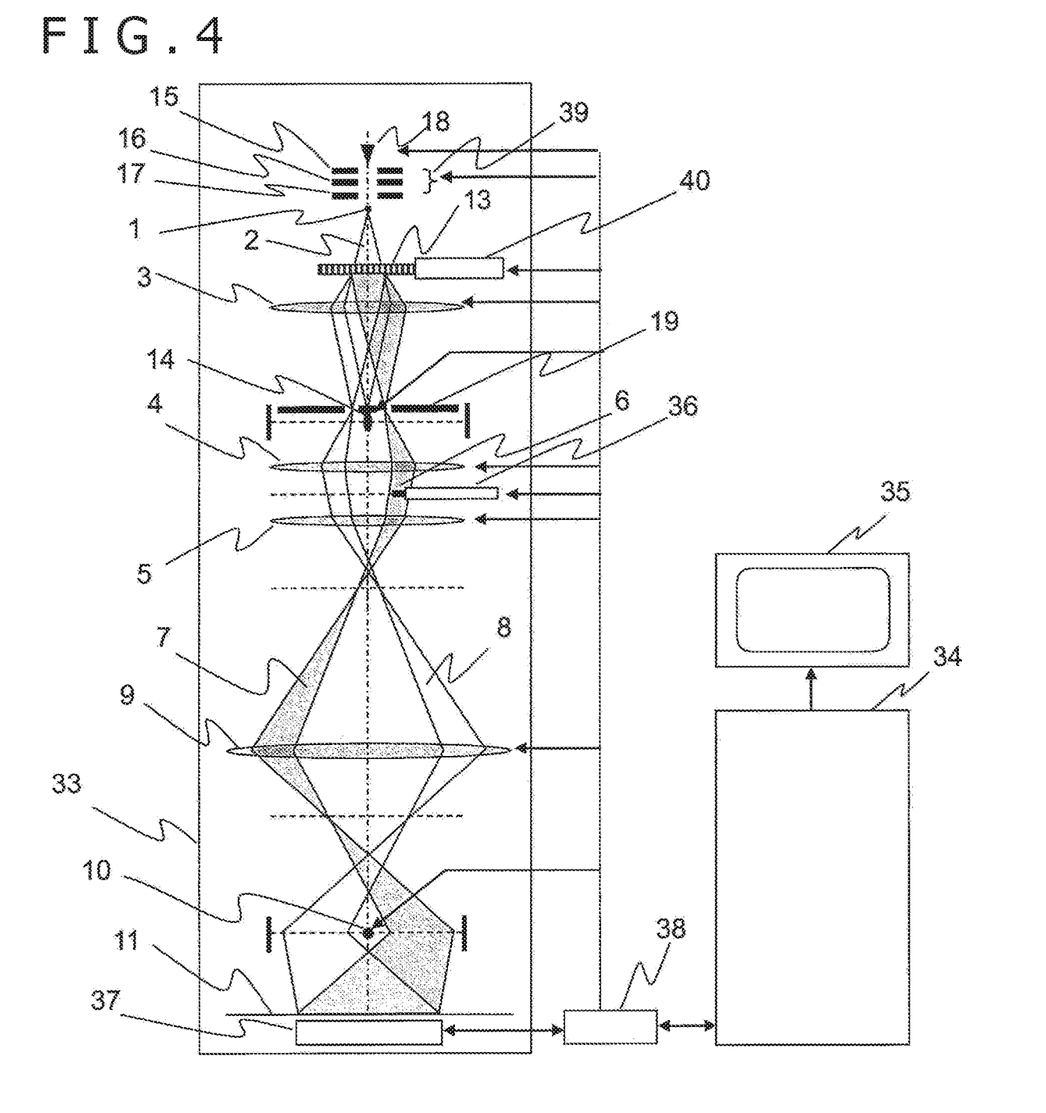
FIG. 4 is a view illustrating the makeup of an interferometric electron microscope including a mask according to the second embodiment of the present invention.

FIG. 4 is a schematic view illustrating an interferometric electron microscope according to a second embodiment of the present invention. The interferometric electron microscope according to the present embodiment includes an artificial grating 13, a mask 19, an electron beam biprism 14 in an irradiating system, and a specimen 6 arranged in the order named. Since the makeup of the electron microscopy apparatus is similar to the first embodiment, those components that are identical to those of the first embodiment will not be described below, and those details of the apparatus makeup which are different from the first embodiment will be described below.

The mask 19 is disposed downstream of the electron source 1 with respect to the direction of the electron beam, on a plane onto which an image of the electron source 1 is focused as a virtual image or a real image by an electron lens of the irradiating system. A 0th-order diffracted wave that has passed through the artificial grating 13 and high-order diffracted waves including 2nd- or higher-order diffracted waves are interrupted by the mask 19, whereas only left and right +/−1st-order diffracted waves are allowed to pass as an object wave 7 and a reference wave 8, respectively, through the mask 19. The interference pattern is thus prevented from being complicated by the high-order diffracted waves, allowing highly accurate observations to be made.

Figure 5:
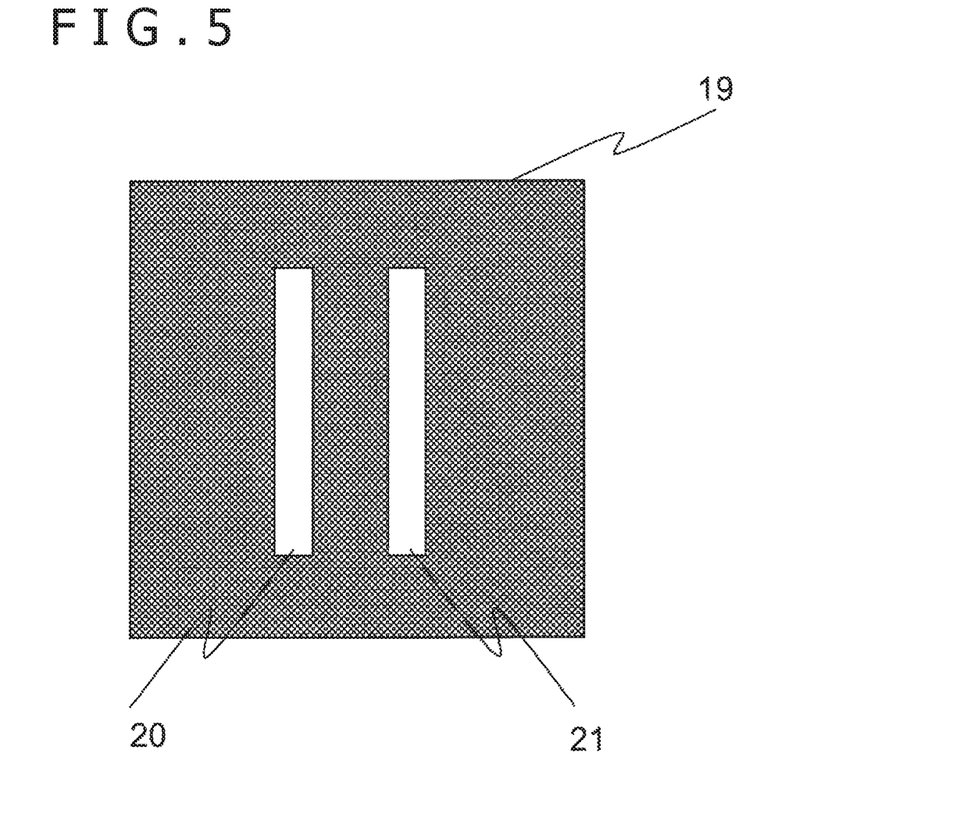
FIG. 5 is a view illustrating by way of example the structure of the mask according to the second embodiment.

FIG. 5 depicts the mask 19 by way of example. The mask 19 has a hole 20 defined therein for passing a first electrode wave, i.e., an object wave, therethrough and a hole 21 defined therein for passing a second electrode wave, i.e., a reference wave, therethrough.

The electron beam biprism 14 in the irradiating system has an electrode filament disposed in a shadow of the mask, and acts to control the distance between the object wave 7 and the reference wave 8 on the specimen plane.

The second embodiment represents a most simple arrangement for realizing the principles of the present invention. The mask 19 illustrated in FIG. 5 is of a structure having two holes that interrupts the 0th-order diffracted wave that has passed through the artificial grating 13. The second embodiment may be combined with the first embodiment such that the 0th-order diffracted wave that has passed through the artificial grating 13 is interrupted by the electrode filament of the electron beam biprism in the irradiating system, with the mask having one hole. Although the mask 19 is disposed in the vicinity of the electron beam biprism 14 in the irradiating system in FIG. 4, the mask 19 may be disposed in any optically equivalent position on the optical axis. The optically equivalent position is not limited to a position in the irradiating system, but may be on a plane in the focusing system on which an image of the electron source 1 is focused as a virtual image or a real image by the action of the electron lenses in the irradiating system and the focusing system.

As to how the object wave 7 and the reference wave 8 according to the present embodiment are selected, they are not limited to only the left and right +/−1st-order diffracted waves diffracted by the artificial grating 13, but may be the 0th-order diffracted wave and either one of the +/−1st-order diffracted waves. Especially in case the specimen is thick, since the object wave needs to be bright, it is effective to select the 0th-order diffracted wave from the artificial grating 13 as the object wave 7.

The present embodiment essentially resides in the mask 19 that interrupts those of the diffracted waves from the artificial grating 13 that are not selected as the object wave 7 and the reference wave 8, and is not limited to the apparatus arrangement illustrated in FIG. 4.

According to the present embodiment, in addition to providing the advantages described in relation to the above principles and makeup according to the present invention, it is possible to select and observe desired diffracted waves as the mask 19 interrupts those of the diffracted waves from the artificial grating 13 that are not selected as the object wave 7 and the reference wave 8.

Embodiment 3

Figure 6:
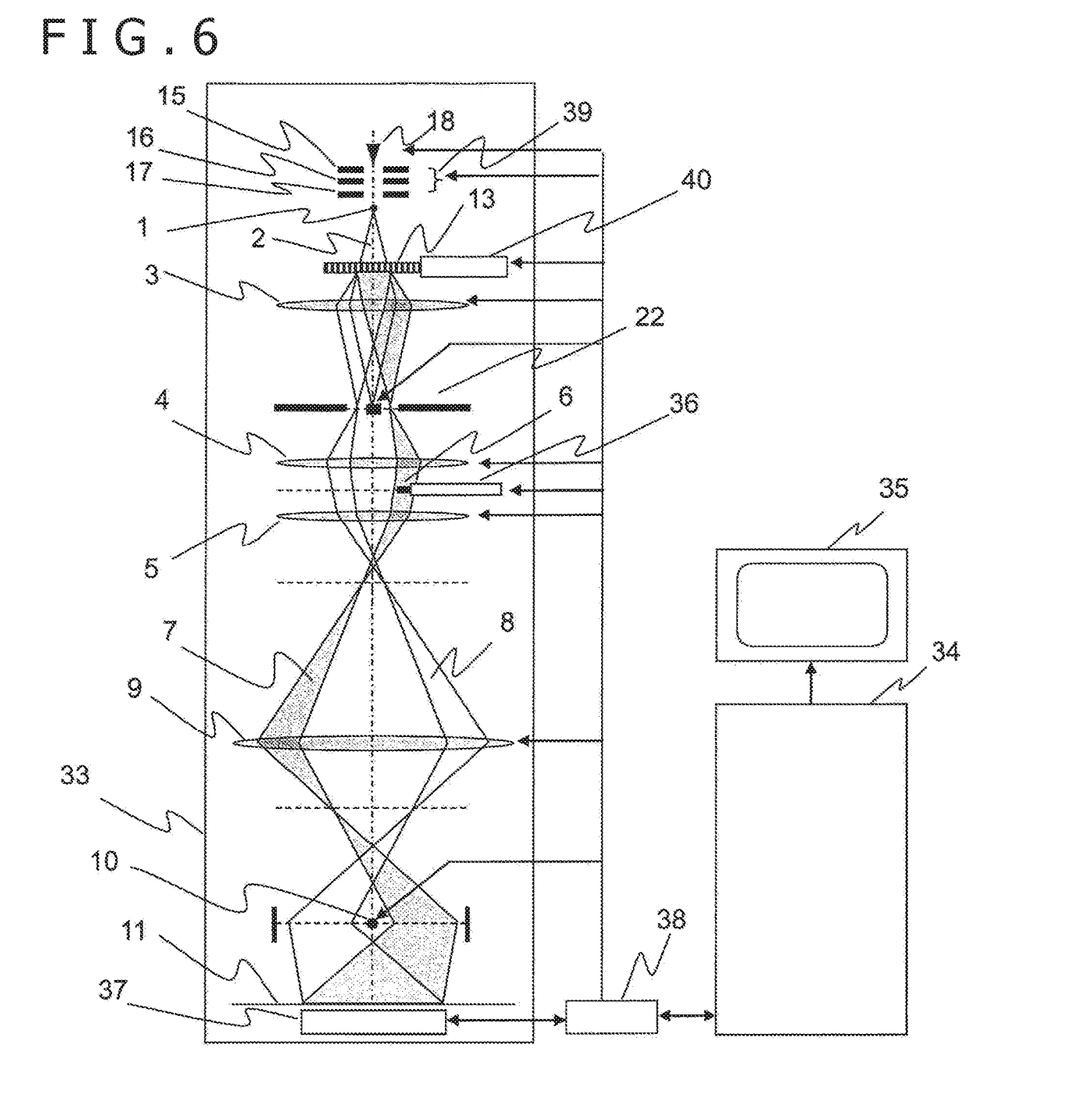
FIG. 6 is a view illustrating the makeup of an interferometric electron microscope including a mask that doubles the function of an electron beam biprism according to a third embodiment of the present invention.

FIG. 6 is a schematic view illustrating an interferometric electron microscope according to a third embodiment of the present invention. The interferometric electron microscope according to the present embodiment includes an artificial grating 13, a voltage-applied mask 22, and a specimen 6 arranged in the order named. Since the makeup of the electron microscopy apparatus is similar to the first embodiment, those components that are identical to those of the first embodiment will not be described below, and those details of the apparatus makeup which are different from the first embodiment will be described below.

The artificial grating 13, the voltage-applied mask 22, and the specimen 6 are disposed in the order named downstream of the electron source 1 with respect to the direction along which an electron beam travels.

The voltage-applied mask 22 is disposed on a plane onto which an image of the electron source 1 is focused as a virtual image or a real image by an electron lens of the irradiating system. The voltage-applied mask 22 interrupts a 0th-order diffracted wave that has passed through the artificial grating 13, and passes only left and right +/−1st-order diffracted waves as an object wave 7 and a reference wave 8, respectively, therethrough. The interference pattern is thus prevented from being complicated by the high-order diffracted waves, allowing highly accurate observations to be made.

Figure 7:
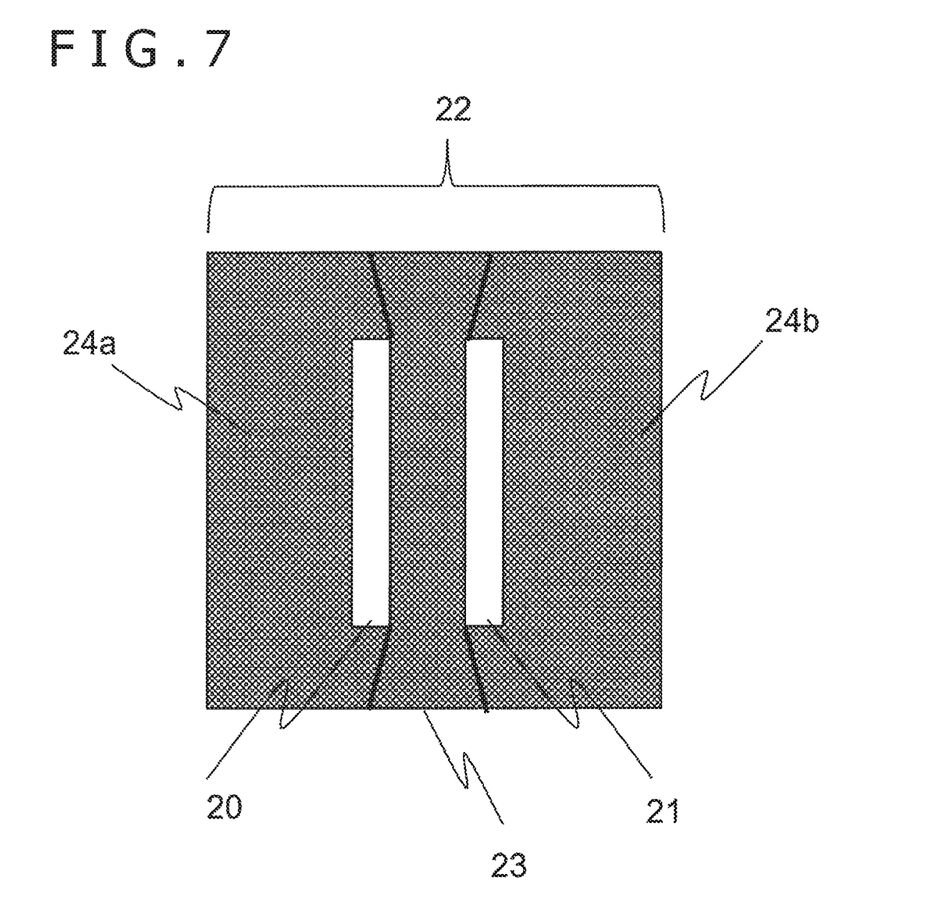
FIG. 7 is a view illustrating by way of example the structure of the mask that doubles as the function of the electron beam biprism according to the third embodiment.

FIG. 7 depicts the voltage-applied mask 22 by way of example. The voltage-applied mask 22 is able to generate electric fields between a first electrode 23 at a center and second electrodes 24*a* and 24*b* on both sides, and doubles as the function of the electron beam biprism 14 in the irradiating system. The voltage-applied mask 22 acts to control the distance between the object wave 7 and the reference wave 8 on the specimen plane.

The present embodiment essentially resides in the voltage-applied mask 22 that interrupts those of the diffracted waves from the artificial grating 13 that are not selected as the object wave 7 and the reference wave 8 and acts to control the distance on the specimen plane between the two electron waves, and is not limited to the apparatus arrangement illustrated in FIG. 6.

As to how the object wave 7 and the reference wave 8 according to the present embodiment are selected, they are not limited to only the left and right +/−1st-order diffracted waves diffracted by the artificial grating 13, but may be the 0th-order diffracted wave and either one of the +/−1st-order diffracted waves.

According to the present embodiment, in addition to providing the advantages described in relation to the above principles and makeup according to the present invention, it is possible to interrupt those of the diffracted waves from the artificial grating 13 that are not selected as the object wave 7 and the reference wave 8 and to control the distance between the two electron waves on the specimen plane.

Embodiment 4

Figure 8:
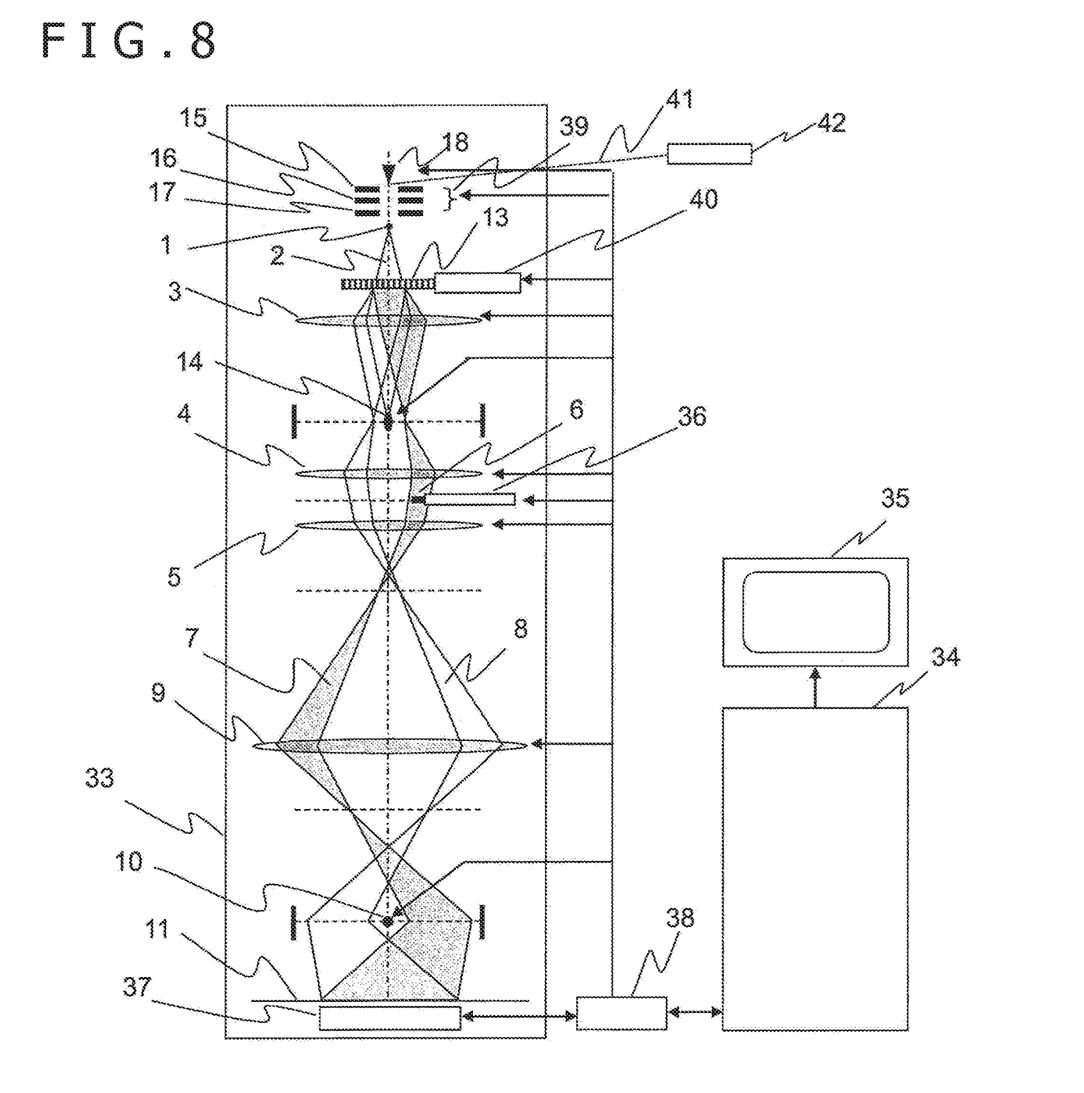
FIG. 8 is a view illustrating the makeup of an interferometric electron microscope including a laser source for exciting an electron source according to a fourth embodiment of the present invention.

FIG. 8 is a schematic view illustrating an interferometric electron microscope according to a fourth embodiment of the present invention. The interferometric electron microscope according to the present embodiment is based on the interferometric electron microscope according to the first embodiment and is characterized in that an electron-source-exciting laser beam 41 from a laser source 42 is applied to an electron source. Since the fourth embodiment is similar to the first embodiment, those components that are identical to those of the first embodiment will not be described below, and those details of the apparatus makeup which are different from the first embodiment will be described below.

A physical electron source 18 is excited by the electron-source-exciting laser beam 41 to control the timing to emit an electron beam. The interferometric electron microscope is a microscope capable of controlling the state of a specimen with a laser beam that irradiates a specimen, not depicted. The interferometric electron microscope can record a dynamic behavior of the sample during only a certain time by synchronizing the control of the specimen state and the timing of electron beam emission.

The present embodiment essentially resides in an apparatus that selects two of the diffracted waves from the artificial grating 13 as the object wave 7 and the reference wave 8 and controls the distance between those electron waves on the specimen plane with the action of the electron beam biprism, and in the apparatus, the timing to generate the electron wave 2 is controlled by the electron-source-exciting laser beam 41. The present embodiment is not limited to the apparatus makeup illustrated in FIG. 8. The electron source according to the second embodiment illustrated in FIG. 4 or the third embodiment illustrated in FIG. 6, for example, may be excited by the electron-source-exciting laser beam 41 to control the timing to produce the electron wave.

According to the present embodiment, in addition to providing the advantages described in relation to the above principles and makeup according to the present invention, it is possible to record a dynamic behavior of the sample during only a certain time by exciting the electron source with the electron-source-exciting laser beam to control the timing to emit the electron beam and synchronizing the control of the specimen state and the timing of electron beam emission.

Embodiment 5

Figure 9:
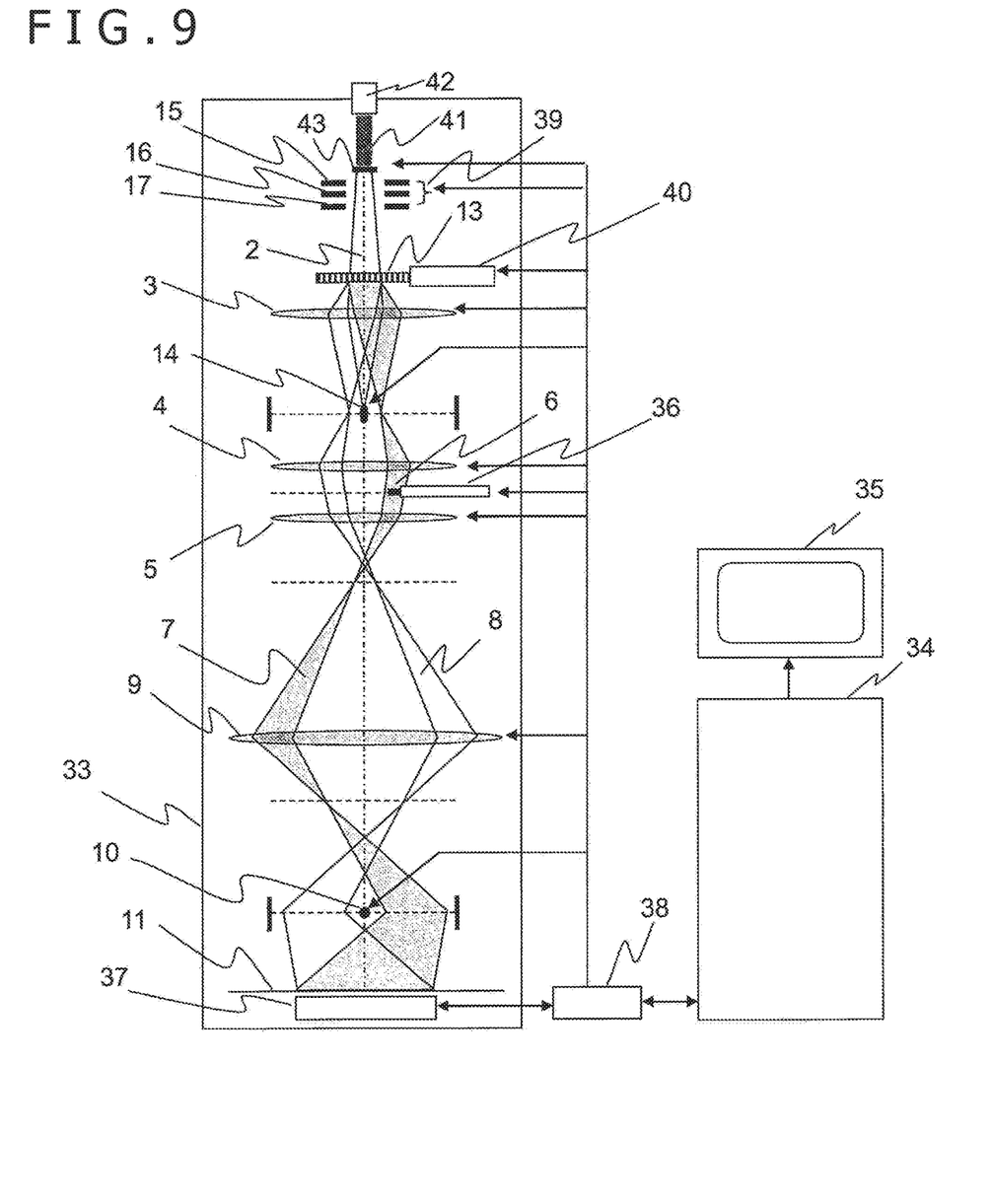
FIG. 9 is a view illustrating the makeup of an interferometric electron microscope including a laser source for exciting a planar light source according to a fifth embodiment of the present invention.

FIG. 9 is a schematic view illustrating an interferometric electron microscope according to a fifth embodiment of the present invention. Since the interferometric electron microscope according to the present embodiment is similar to the interferometric electron microscope according to the fourth embodiment, those components that are identical to those of the fourth embodiment will not be described below, and those details of the apparatus makeup which are different from the fourth embodiment will be described below.

The interferometric electron microscope according to the present embodiment is characterized in that it has a surface light source 43 as an electron source and an electron-source-exciting laser beam 41 from a laser source 42 is applied to the surface light source 43. The surface light source may be a surface light source having negative electron affinity, for example, though it may be other surface light sources. In case a surface having negative electron affinity is used as a surface light source, a surface treatment device should preferably be disposed in the vicinity of the electron source for the maintenance of the surface light source. However, since any ancillary structures relative to the surface treatment device have no bearing on the present invention, they will not be described hereinafter.

An electron wave 2 emitted from the surface light source 43 is focused by the action of a lens in the irradiating system. Diffracted waves from the artificial grating 13 are also focused on the position where the electron wave is focused. The electron beam biprism 14 in the irradiating system is disposed in this position. Two of the diffracted waves diffracted by the artificial grating 13 are used as the object wave 7 and the reference wave 8, and the distance between the object wave 7 and the reference wave 8 on the specimen plane is controlled by the action of the electron beam biprism 14 in the irradiating system.

The interferometric electron microscope according to the present embodiment is a microscope capable of controlling the state of a specimen with a laser beam that irradiates a specimen, not depicted. The interferometric electron microscope can record a dynamic behavior of the sample during only a certain time by synchronizing the control of the specimen state and the timing of electron beam emission.

The present embodiment essentially resides in an apparatus that selects two of the diffracted waves from the artificial grating 13 as the object wave 7 and the reference wave 8 and controls the distance between those electron waves on the specimen plane with the action of the electron beam biprism, and in the apparatus, the timing to generate the electron wave 2 is controlled by the electron-source-exciting laser beam 41 that irradiates the surface light source 43. The present embodiment is not limited to the apparatus makeup illustrated in FIG. 9. The electron source according to the second embodiment illustrated in FIG. 4 or the third embodiment illustrated in FIG. 6, for example, may be replaced with the surface light source 43, which may be excited by the electron-source-exciting laser beam 41 to control the timing to produce the electron wave.

According to the present embodiment, in addition to providing the advantages described in relation to the above principles and makeup according to the present invention, it is possible to record a dynamic behavior of the sample during only a certain time by controlling the timing to produce the electron wave from the surface light source as the electron source with the electron-source-exciting laser beam that irradiates the surface light source thereby synchronize the control of the specimen state and the timing of electron beam emission.

INDUSTRIAL APPLICABILITY

The interferometric electron microscope according to the present invention described above can be put to practical use as an electron beam interferometric apparatus and an electron beam holography apparatus. The present invention as embodied in these apparatuses is able to analyze nanostructures, observe magnetic fields and electric fields occurring in nanoscale structures, and measure electron spin distributions in materials with high sensitivity, and also to increase time resolution and enable dynamic observations. The interferometric electron microscope according to the present invention makes it possible to make observations with high degrees of freedom with the action of the electron beam biprism in the irradiating system and to enable time-resolution observations of basic materials, semiconductor devices, and spintronics materials, and is expected to be used in the research and development of spintronics devices. Furthermore, the interferometric electron microscope according to the present invention enables electromagnetic field analyses of living bodies in combination with a single-particle analysis approach, and is expected to contribute to the creation of new medicine.

What is claimed is:

1. An interferometric electron microscope causing electron waves to interfere with each other, comprising:
    an electron source;
    an irradiating lens system irradiating a specimen with an electron beam emitted from the electron source;
    a focusing lens system focusing an image of the specimen;
    an observational plane used for observing the image of the specimen focused by the focusing lens system;
    an artificial grating disposed between the electron source and the irradiating lens system and diffracting the electron beam emitted from the electron source to produce a first electron wave and a second electron wave;
    an artificial grating inching drive connected to the artificial grating and to a controller;
    an electron beam biprism an irradiating system, disposed in the irradiating lens system and deflecting the first electron wave and the second electron wave to pass the first electron wave through the specimen for use as an object wave and to use the second electron wave as a reference wave; and
    an electron beam biprism in a focusing system, disposed in the focusing lens system and deflecting the objective wave and the reference wave to superimpose the objective wave and the reference wave on the observational plane so as to produce an image,
    wherein the controller is configured rotate an orientation of the artificial grating, using the artificial grating inching drive, with respect to said electron beam biprism in the irradiating system according to a stored data file.

2. The interferometric electron microscope according to claim 1, further comprising:
    a controller for adjusting a potential applied to the electron beam biprism in the irradiating system to adjust positions where the first electron wave and the second electron wave irradiate a specimen plane.

3. The interferometric electron microscope according to claim 1,
    wherein an interference image of the specimen, the interference image being focused on the observational plane, is observed or recorded.

4. The interferometric electron microscope according to claim 1,
    wherein the electron beam biprism in the irradiating system includes an electrode filament disposed in a position where the electrode filament interrupts a 0th-order diffracted wave of diffracted waves from the artificial grating.

5. The interferometric electron microscope according to claim 4,
    wherein the electrode filament of the electron beam biprism in the irradiating system has a cross-sectional shape having a thickness along a direction in which the electron beam is propagated.

6. The interferometric electron microscope according to claim 1,
    wherein the electron beam biprism in the irradiating system and the electron beam biprism in the focusing system deflect the first electron wave and the second electron wave to produce electron beam interference fringes that are observed or recorded, in an area of the observational plane in which the objective wave and the reference wave are superimposed.

7. The interferometric electron microscope according to claim 1, wherein
    the irradiating lens system includes two electron beam biprisms, and
    the two electron beam biprisms of the irradiating lens system deflect the electron waves to control positions and angles at which the first electron wave and the second electron wave irradiate a specimen plane.

8. The interferometric electron microscope according to claim 1, wherein
    the focusing lens system includes a plurality of electron beam biprisms, and
    the plurality of electron beam biprisms of the focusing lens system deflect the electron waves to control an interference area of the observational plane and interference fringe intervals on the observational plane.

9. The interferometric electron microscope according to claim 1, further comprising:
    a mask interrupting a 0th-order diffracted wave and/or 2nd- or higher-order diffracted waves of electron waves diffracted by the artificial grating.

10. The interferometric electron microscope according to claim 1, wherein the electron source is excited by a laser beam to control a timing to generate an electron wave.

11. The interferometric electron microscope according to claim 10, wherein
the electron source includes a surface light source, and the laser beam excites a surface electron source.

12. An interferometric electron microscope causing electron waves to interfere with each other, comprising:
an electron source;
an irradiating lens system irradiating a specimen with an electron beam emitted from the electron source;
a focusing lens system focusing image of the specimen;
an observational plane used for observing the image of the specimen focused by the focusing lens system;
an artificial grating disposed between the electron source and the irradiating lens system and diffracting the electron beam emitted from the electron source to produce a first electron wave and a second electron wave;
a voltage-applied mask in an irradiating system, disposed in the irradiating lens system and deflecting the first electron wave and the second electron wave to pass the first electron wave through the specimen for use as an object wave and to use the second electron wave as a reference wave; and
an electron beam biprism in a focusing system, disposed in the focusing lens system and deflecting the objective wave and the reference wave to superimpose the objective wave and the reference wave on the observational plane so as to produce an image,
wherein the voltage-applied mask interrupts electron waves other than diffracted waves used as the first electron wave and the second electron wave, of electron waves diffracted by the artificial grating, and
wherein the voltage-applied mask deflects the electron waves to control positions and angles at which the first electron wave and the second electron wave irradiate a specimen plane.

* * * * *